United States Patent
Cui

(10) Patent No.: US 11,678,525 B2
(45) Date of Patent: Jun. 13, 2023

(54) DISPLAY SUBSTRATE, MANUFACTURING METHOD THEREOF, AND DISPLAY DEVICE

(71) Applicant: BOE Technology Group Co., Ltd., Beijing (CN)

(72) Inventor: Ying Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/711,269

(22) Filed: Apr. 1, 2022

(65) Prior Publication Data
US 2022/0231101 A1     Jul. 21, 2022

Related U.S. Application Data

(63) Continuation of application No. 16/380,602, filed on Apr. 10, 2019, now abandoned.

(30) Foreign Application Priority Data

Sep. 17, 2018 (CN) .......................... 201811079246.7

(51) Int. Cl.
H01L 27/32     (2006.01)
(52) U.S. Cl.
CPC .......... *H10K 59/122* (2023.02); *H10K 71/00* (2023.02); *H10K 71/135* (2023.02); *H10K 59/1201* (2023.02)
(58) Field of Classification Search
None
See application file for complete search history.

(56) References Cited

U.S. PATENT DOCUMENTS

| | | | |
|---|---|---|---|
| 9,318,543 B2 | 4/2016 | Lee et al. |
| 2007/0052349 A1 | 3/2007 | Giraldo et al. |
| 2007/0200488 A1 | 8/2007 | Ito |
| 2008/0036374 A1 | 2/2008 | Okano |
| 2008/0238295 A1 | 10/2008 | Takei et al. |
| 2010/0289728 A1 | 11/2010 | Nakatani et al. |
| | (Continued) | |

FOREIGN PATENT DOCUMENTS

| | | |
|---|---|---|
| CN | 104659059 A | 5/2015 |
| CN | 105742311 A | 7/2016 |
| CN | 108346677 A | 7/2018 |

OTHER PUBLICATIONS

Office Action from Chinese Patent Application No. 201811079246.7, dated Feb. 25, 2020, 11 pages.

(Continued)

*Primary Examiner* — Benjamin P Sandvik
(74) *Attorney, Agent, or Firm* — Westman, Champlin & Koehler, P.A.

(57) ABSTRACT

Embodiments of the present application provide a display substrate comprising a plurality of first banks distributed in a first direction and a plurality of second banks distributed in a second direction. Two adjacent first banks define a group of sub-pixel units of the display substrate, and two adjacent second banks define one sub-pixel unit. The first bank has a height greater than a height of the second bank. Embodiments of the present application also disclose a manufacturing method of a display substrate and a display device.

20 Claims, 2 Drawing Sheets

(56) References Cited

U.S. PATENT DOCUMENTS

| | | |
|---|---|---|
| 2012/0313509 A1* | 12/2012 | Takagi .................. H05B 33/10 313/504 |
| 2015/0137090 A1 | 5/2015 | Lee et al. |
| 2016/0359112 A1 | 12/2016 | Wang et al. |
| 2017/0213881 A1 | 7/2017 | Kondo |
| 2017/0287993 A1 | 10/2017 | Takata |
| 2017/0301889 A1 | 10/2017 | Hayashida et al. |
| 2018/0233694 A1 | 8/2018 | Ajiki et al. |

OTHER PUBLICATIONS

Office Action from Chinese Patent Application No. 201811079246.7, dated Apr. 29, 2020, 3 pages.

U.S. Patent Office issued prosecution for U.S. Appl. No. 16/380,602, filed Apr. 10, 2019, including: Non-Final Rejection dated Mar. 19, 2020, 11 pages; Final Rejection dated Jul. 31, 2020, 12 pages; Non-Final Rejection dated Dec. 9, 2020, 13 pages; Final Rejection dated Mar. 26, 2021, 13 pages; Non-Final Rejection dated Sep. 22, 2021, 14 pages; Final Rejection dated Jan. 4, 2022, 16 pages; 79 pages total.

\* cited by examiner

DISPLAY SUBSTRATE, MANUFACTURING METHOD THEREOF, AND DISPLAY DEVICE

CROSS REFERENCE TO RELATED APPLICATION

This application is a continuation application of U.S. patent application Ser. No. 16/380,602, filed on Apr. 10, 2019, which published as U.S. Publication No. 2020/0091254, on Mar. 19, 2020, which claims priority to Chinese Patent Application No. 201811079246.7, filed on Sep. 17, 2018, the entire contents of which are incorporated herein by reference in their entireties.

TECHNICAL FIELD

The present disclosure relates to the technical field of display, and particularly to a display substrate, a manufacturing method thereof, and a display device.

BACKGROUND

In various film forming technologies, solution film forming technologies attract more and more attention. So-called solution film forming procedure is a process comprising treating required materials, for example, breaking them into nanoscale fine particles, subsequently dissolving them in a solvent, and then using another instrument to deposit the solution on a surface of a substrate, so as to form a required film on the surface of the substrate after the solvent is evaporated.

Ink jet printing, an important one of the solution film forming technologies, is widely used in manufacturing polymer light emitting diode (PLED), liquid crystal display (LCD) color filter, organic thin film transistor, metal electrode, three dimension separating wall and the like, due to its advantages of easy operation, low cost, simple process, easy achievement of large size and so on.

With increasingly higher demand for the resolution of a display device at present, a stricter requirement is proposed for the film forming homogeneity within pixels formed by technologies such as ink jet printing.

SUMMARY

The present disclosure provides a display substrate, a manufacturing method thereof, and a display device.

In one aspect, the present disclosure provides a display substrate comprising: a base substrate; and a plurality of first banks distributed in a first direction and a plurality of second banks distributed in a second direction on the base substrate, two adjacent first banks defining a group of sub-pixel units of the display substrate, the second banks being disposed between two adjacent first banks, and two adjacent second banks defining one of the sub-pixel units, wherein the first bank has a height greater than a height of the second bank.

In some embodiments, the second bank has a height less than a height of a liquid surface of a solution applied for forming a film layer of the sub-pixel units by a solution process.

In some embodiments, a top surface of the second bank has a property of being phobic to the solution (or being repellent to the solution).

In some embodiments, a top surface of the first bank has a property of being phobic to the solution.

In some embodiments, all of the first banks have the same height.

In some embodiments, the height of the first bank is in a range of from 1 μm to 3 μm.

In some embodiments, all of the second banks have the same height.

In some embodiments, the height of the second bank is in a range of from 100 nm to 500 nm.

In some embodiments, the display substrate further comprises end banks disposed between two adjacent first banks, wherein the end banks are disposed in the same direction as the second banks but on outermost sides of the second banks.

In some embodiments, the end banks have a height greater than a height of the second bank.

In some embodiments, all of the first banks have the same width in a range of from 10 μm to 30 μm in the first direction, and the first banks have a strip shape.

In some embodiments, all of the second banks have the same width in a range of from 5 μm to 20 μm in the second direction, and the second banks have a strip shape.

In another aspect, the present disclosure provides a display device comprising the above-mentioned display substrate.

In some embodiments, the display device includes polymer light emitting diode (PLED).

In still another aspect, the present disclosure provides a manufacturing method of a display substrate, comprising: fabricating a plurality of first banks in a first direction on a base substrate, two adjacent first banks defining a group of sub-pixel units of the display substrate; and fabricating a plurality of second banks in a second direction between each pair of two adjacent first banks, two adjacent second banks defining one of the sub-pixel units, wherein the first bank has a height greater than a height of the second bank.

In some embodiments, the manufacturing method further comprises fabricating end banks between two adjacent first banks, wherein the end banks are disposed in the same direction as the second banks but on outermost sides of the second banks.

In some embodiments, after fabricating the second banks, the method further comprises:

fabricating a film layer by a solution process on the base substrate on which the first banks and the second banks are fabricated, a liquid surface of the applied solution having a height between the height of the first bank and the height of the second bank.

In some embodiments, after fabricating the plurality of second banks in the second direction between each pair of two adjacent first banks, and before fabricating the film layer by a solution process on the base substrate on which the first banks and the second banks are fabricated, the method further comprises:

fabricating a film having a property of being phobic to the solution on a top surface of the second bank.

In some embodiments, the fabricating the film layer by a solution process on the base substrate on which the first banks and the second banks are fabricated comprises:

fabricating the film layer by an ink jet printing process on the base substrate on which the first banks and the second banks are fabricated.

In some embodiments, after fabricating the film layer by a solution process on the base substrate on which the first banks and the second banks are fabricated, the method further comprises: subjecting the film layer fabricated to a drying treatment, such that the treated film layer has a height less than the height of the second bank.

BRIEF DESCRIPTION OF DRAWINGS

The above and/or additional aspects and advantages of the present disclosure will become apparent and easily under

DETAILED DESCRIPTION

Figure 1:
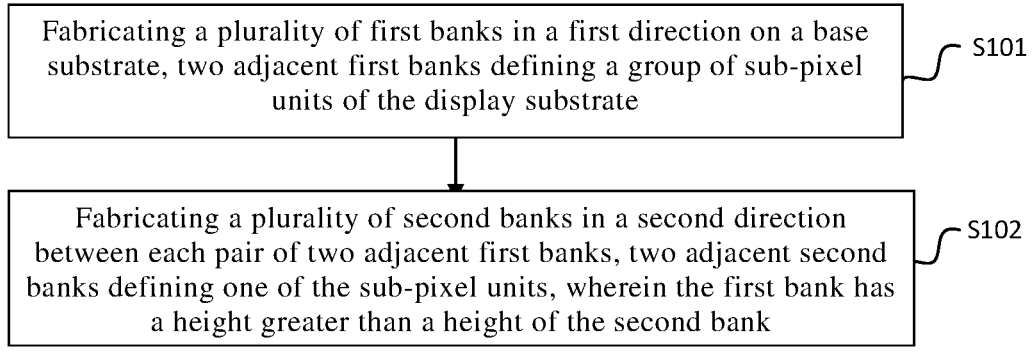
- FIG. 1 is a flow chart of a manufacturing method of a display substrate according to an embodiment of the present disclosure.

The embodiments of the present disclosure will be described in detail below. The examples of the embodiments are shown in the drawings, throughout which identical or similar reference numbers indicate identical or similar elements or elements having identical or similar functions. The embodiments described below with reference to the drawings are exemplary, and are only intended to illustrate the present invention, but cannot be interpreted to limit the present invention.

It can be appreciated by those skilled in the art that the singular forms "a", "an", "said" and "the" as used herein may include plural references, unless specifically indicated otherwise. It should be further appreciated that the wording "comprise/comprising" as used in the description of the present disclosure means that the recited feature, integer, step, operation, element and/or component are present, but the presence or addition of one or more additional features, integers, steps, operations, elements, components and/or a combination thereof is not excluded. It should be appreciated that when an element is said to be "connected" to another element, it may be directly connected to another element, or there may be an intermediate element. In addition, the term "connecting/connection" as used herein may include wireless connection. The wording "and/or" as used herein is intended to include all or any one member of one or more associated items as listed, and all combinations thereof.

It can be appreciated by those skilled in the art that all terms as used herein (including technical terms and scientific terms) have the same meanings as commonly understood by one of ordinary skill in the art to which the present invention pertains, unless otherwise defined. It should also be appreciated that the terms as defined in general dictionaries should be understood as having the same meanings as those in the context of prior art, and will not be interpreted with an idealized or too formal meaning unless specifically defined herein.

The applicant has discovered that in the case of printing ink in sub-pixels by an ink jet printing technology, the printed inks in the sub-pixel units are separated from each other. In order to obtain homogeneous film forming between pixels, it is required to continuously adjust the volume difference between the nozzles of the sprayer. However, the degree of the adjustment is limited, and thus it is difficult to enable the volumes injected from the nozzles to be completely consistent with each other. As such, difference in film forming between the pixels will occur during drying, leading to inhomogeneous light emitting between sub-pixels.

Therefore, the applicant provides a film forming method for a film layer, in order to at least partially alleviate or eliminate the problem of inhomogeneous film forming within the sub-pixel regions.

FIG. 1 shows a flow chart of a manufacturing method of a display substrate according to an embodiment of the present disclosure. The method comprises the following steps.

S101: Fabricating a plurality of first banks in a first direction on a base substrate, two adjacent first banks defining a group of sub-pixel units of the display substrate.

Here, in the above S101, the first direction may be a row direction from a front view direction of the base substrate, and a group of sub-pixel units may be a column of sub-pixel units in the front view direction of the base substrate. That is, in an embodiment of the present disclosure, a plurality of first banks are fabricated in the row direction on the base substrate, and a region between two adjacent first banks corresponds to a column of sub-pixel units of the display substrate (i.e., two adjacent first banks define a column of sub-pixel units).

S102: Fabricating a plurality of second banks in a second direction between each pair of two adjacent first banks, two adjacent second banks defining one of the sub-pixel units, wherein the first bank has a height greater than a height of the second bank.

Here, in the above S102, the second direction may be a column direction from a front view direction of the base substrate. In an embodiment of the present disclosure, a plurality of second banks are fabricated in the column direction between each pair of two adjacent first banks, and a region between two adjacent second banks corresponds to one sub-pixel unit (i.e., two adjacent second banks define one sub-pixel unit).

In a particular embodiment, the manufacturing method further comprises a step of fabricating end banks between two adjacent first banks, wherein the end banks are disposed in the same direction as the second banks but on outermost sides of the second banks. The end bank may have the same height as the height of the first bank.

In a particular embodiment, after the above S102, the manufacturing method of a display substrate further comprises: fabricating a film layer by a solution process on the base substrate on which the first banks and the second banks are fabricated, a liquid surface of the applied solution having a height between the height of the first bank and the height of the second bank.

In the embodiments of the present disclosure, by fabricating a plurality of first banks having a larger height and a plurality of second banks having a smaller height on the base substrate, two adjacent first banks define a group of sub-pixel units of the display substrate, and two adjacent second banks define one sub-pixel unit. In fabricating a film layer by a solution process, when the applied solution has a liquid surface higher than the second bank, the solution can flow between the sub-pixel units across the second banks with a smaller height, such that there is an equal volume of solution in each sub-pixel unit. As such, a film layer with uniform thickness will be formed in each sub-pixel unit, overcoming the problem of inhomogeneous thickness of the film layers in the sub-pixel units, and in turn improving the homogeneity of light emitting in the sub-pixel units.

Further, in order to allow the formed films in different sub-pixel units to be separated from each other after subsequent drying, so as to avoid the interference between different sub-pixel units and avoid the retention of solution, the method may further comprise, after fabricating the plurality of second banks in the column direction between each pair of two adjacent first banks and before fabricating the film layer by a solution process on the base substrate on which the first banks and the second banks are fabricated: fabricating a film having a property of being phobic to the solution on a top surface (a surface on a side away from the substrate) of the second bank.

Optionally, in the embodiments of the present disclosure, a top surface of the first bank may also have a property of being phobic to the solution, such that the solution in each column of the sub-pixel units will not overflow during film forming, avoiding the interference between different columns of the sub-pixel units.

In particular, with respect to the manufacturing method of the first banks, fabricating the plurality of first banks in the row direction on the base substrate may comprise: fabricating the plurality of first banks in the row direction on the base substrate by a patterning process.

In particular, with respect to the manufacturing method of the second banks, fabricating the plurality of second banks in the column direction between each pair of two adjacent first banks may comprise: fabricating the plurality of second banks in the column direction between each pair of two adjacent first banks by a patterning process or a deposition process. The patterning process in the embodiments of the present disclosure comprises some or all of applying, exposing, developing and etching procedures.

In the embodiments of the present disclosure, a film layer may be fabricated by ink jet printing on the base substrate on which the first banks and the second banks are fabricated, because ink jet printing is an important one of solution film forming technologies, and has advantages of easy operation, low cost, simple process, easy achievement of large size, and the like. However, for those skilled in the art, the film layer may also be fabricated by another solution film forming process on the base substrate with the first banks and the second banks in embodiments of the present disclosure.

In order to more rapidly form a film layer, the method of the embodiments of the present disclosure further comprises, after fabricating the film layer by a solution process on the base substrate on which the first banks and the second banks are fabricated: subjecting the film layer fabricated to a drying treatment, such that the treated film layer has a height less than the height of the second bank, thereby finally forming film layers with uniform thickness in the sub-pixel units. Of course, during practical production, the drying treatment may not be performed, and the film layer fabricated is naturally air dried, which, however, will extend the production time.

The film forming method of the embodiments of the present disclosure will be explained below by describing each step in detail.

Figure 2:
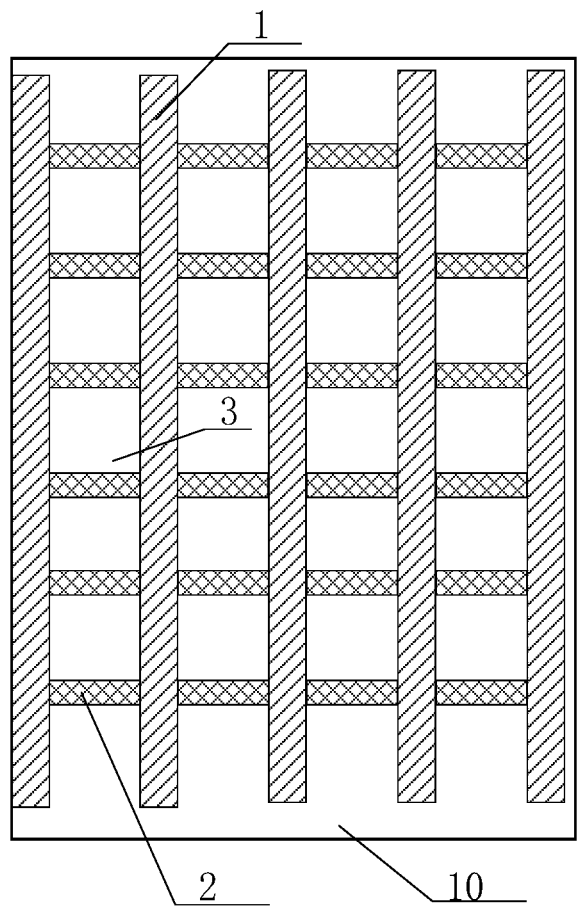
FIG. 2 is a schematic structure diagram of a display substrate according to an embodiment of the present disclosure.

As shown in FIG. 2, firstly, a plurality of first banks 1 are fabricated in a row direction (such as a horizontal direction) on a base substrate 10, wherein two adjacent first banks 1 define a column of sub-pixel units; and then, a plurality of second banks 2 are fabricated in a column direction (such as a vertical direction) between each pair of two adjacent first banks 1 on the base substrate 10, wherein two adjacent second banks 2 define one sub-pixel unit 3.

It should be noted that an end bank 2' is disposed at an end of each column of sub-pixel units (two end banks at both ends), wherein a height of the end bank 2' is greater than a height of the second bank 2, and may be equal to or greater than a height of the first bank 1. In addition, a top surface of end bank 2' may have a property of being phobic to the solution, so as to prevent the solution from overflowing from the end of the column during film forming.

In a particular embodiment, each second bank and each end bank have a top surface away from the base substrate, a bottom surface close to the base substrate, and lateral surfaces connecting the top surface and the bottom surface, and a size of the top surface of the second bank in a second direction (such as the column direction) is smaller than a size of the top surface of the end bank in the second. Such configuration shortens the distance between adjacent sub-pixels, to avoid ink residing between adjacent sub-pixels, the resident ink may result in uneven ink distribution and uneven light emission.

Figure 3:
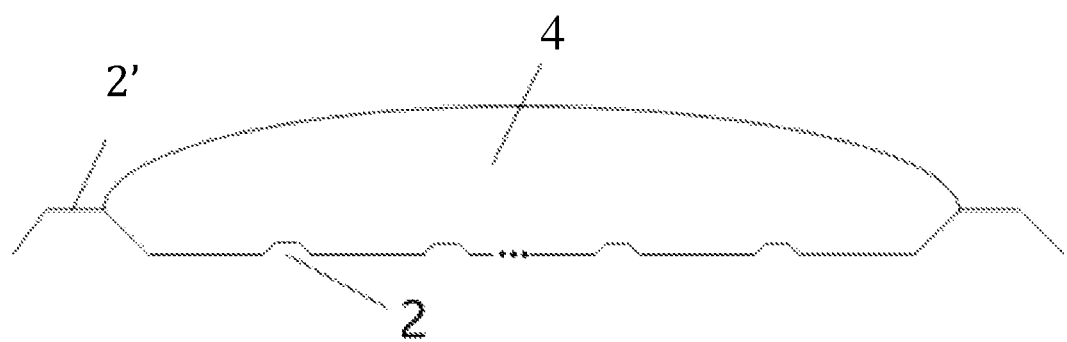
FIG. 3 is a schematic structure diagram of a display substrate according to an embodiment of the present disclosure when a film layer is fabricated by a solution process.

Next, as shown in FIG. 2 and FIG. 3, the solution prepared is applied, e.g. by ink jet printing, into the sub-pixel units. At this time, because the height of the liquid surface of the solution 4 is higher than the height of the second bank 2, the solution injected in each column of the sub-pixel units 3 can flow freely in the sub-pixel units. Because the top surface of the end bank 2' has a property of being phobic to the solution, overflowing of the solution 4 in each column of the sub-pixel units from the end of the column is avoided. In addition, because the top surface of the first bank 1 has a property of being phobic to the solution, the solution 4 in each column of the sub-pixel units will not overflow into an adjacent column, avoiding the interference between different columns of sub-pixel units.

In practical implementations, if a first column of sub-pixel units are red sub-pixel units displaying red color, a second column of sub-pixel units are green sub-pixel units displaying green color, and a third column of sub-pixel units are blue sub-pixel units displaying blue color. In the embodiments of the present disclosure, red ink may be injected into a region corresponding to the first column of sub-pixel units, green ink may be injected into a region corresponding to the second column of sub-pixel units, and blue ink may be injected into a region corresponding to the third column of sub-pixel units; in addition, the second banks 2 are configured such that ink can be in fluid communication with each other within each column of sub-pixel units, and the first banks 1 are configured such that ink in each column does not overflow.

Finally, after each sub-pixel unit is filled with the solution, the film layer formed is subjected to a drying treatment in particular embodiments of the present disclosure. Because the (top) surface of each second bank is fabricated to have a property of being phobic to the solution, as such, during drying, separated film layers with uniform volume are formed in respective sub-pixel units. Because the separated film layers with uniform volume are formed in respective sub-pixel units previously, the homogeneity of the film layer(s) subsequently formed, e.g. by chemical vapor deposition (CVD), can also be improved, thereby improving the homogeneity of light emitting of the sub-pixel units.

In the embodiments of the present disclosure, the sub-pixel units in each column are separated from each other by the second banks, such that when ink is printed in the sub-pixel units by ink jet printing, the sub-pixel units are in communication with each other, that is, the ink is in fluid communication in each column of sub-pixel units, and is thus uniformly distributed in each sub-pixel unit within this column, as a result, the problem of ink volume difference in different sub-pixel units due to different nozzle volumes is eliminated.

The film forming method for a film layer provided by the embodiments of the present disclosure can significantly ameliorate the problem of inhomogeneous film thickness between high resolution printed device pixels, thereby improving the homogeneity of light emitting of the pixels, and in turn improving the light emitting quality and lifetime of the device.

The present disclosure also discloses a display substrate, as shown in FIG. 2, comprising: a base substrate 10; and a plurality of first banks 1 distributed in a first direction and a plurality of second banks 2 distributed in a second direction on the base substrate 10, wherein two adjacent first banks 1 define a group of sub-pixel units 3 of the display substrate, the second banks 2 are disposed between two adjacent first banks 1, and two adjacent second banks 2 define one sub-pixel unit 3. The first bank 1 has a height greater than a height of the second bank 2.

In particular, the second bank 2 has a height less than a height of a liquid surface of a solution applied for forming a film layer by a solution process on the base substrate on which the first banks 1 and the second banks 2 are fabricated.

In a particular embodiment, the first direction is a row direction and the second direction is a column direction when the base substrate is viewed from a front view direction. In the embodiments of the present disclosure, the group of sub-pixel units 3 is a column of sub-pixel units 3.

In a particular embodiment, the display substrate may be an array substrate in a liquid crystal display panel, a color film substrate, or a backplane in an organic electroluminescent display panel.

According to the requirements for practical demand and product, the sub-pixel units 3 may have different shapes. As shown in FIG. 2, because the arrangement direction of the first banks 1 is perpendicular to the arrangement direction of the second banks 2, the sub-pixel units 3 have a rectangular shape. However, for those skilled in the art, the sub-pixel units 3 may have other regular or irregular shapes.

By fabricating a plurality of first banks 1 and second banks 2 having different heights on the base substrate, a region between two adjacent second banks 2 corresponds to one sub-pixel unit 3. When a solution has a liquid surface higher than the second bank 2, the solution can flow within each column of sub-pixel units 3 across the second banks 2 with a smaller height, such that there is an equal volume of solution in each sub-pixel unit 3 of each column of sub-pixel units 3. As such, a film layer with uniform thickness will be formed in each sub-pixel unit 3, overcoming the problem of inhomogeneous thickness of the film layers in the sub-pixel units 3.

Further, in the embodiments of the present application, in order to allow the film layers in the sub-pixel units to be separated in subsequent drying, and to avoid the interference between the sub-pixel units, the surface of the second bank 2 is provided with a property of being phobic to the solution.

Preferably, in the embodiments of the present disclosure, the surface of the first bank has a property of being phobic to the solution, such that film forming in each column of sub-pixel units is separated, avoiding the interference between different columns of sub-pixel units.

In practical implementations, the material of the first bank 1 comprises an organic material, for example, a polyimide material may be selected as the material of the first bank 1; and the material of the second bank 2 may be an organic material or an inorganic material, for example, a silica material may be selected as the material of the second bank 2. However, for those skilled in the art, other materials may also be selected for the first bank 1 and the second bank 2.

In the embodiments of the present disclosure, because the material of the first bank 1 comprises an organic material, the first bank is typically formed on the base substrate by applying, exposing, and developing. When the material of the second bank 2 comprises an inorganic material, the second bank is typically formed on the base substrate by a process such as deposition.

In a preferred embodiment, all of the first banks 1 have the same height in a range of from 1 μm to 3 μm, for example, 1.5 μm. As such, uniform first banks are fabricated on the base substrate, and thus solution overflowing can be better prevented in subsequent fabrication of a film layer by a solution process.

In another preferred embodiment, all of the second banks 2 have the same height in a range of from 100 nm to 500 nm, for example, 300 nm. As such, uniform second banks are fabricated on the base substrate, and thus it is better for allowing an equal volume of solution in each sub-pixel unit of each column of sub-pixel units in subsequent fabrication of a film layer by a solution process, thereby forming a film layer with uniform thickness in each sub-pixel unit.

Further, in particular embodiments of the present disclosure, all of the first banks 1 have the same width in a range of from 10 μm to 30 μm, for example 17 μm, in the row direction. All of the second banks 2 have the same width of 5 μm to 20 μm, for example 10 μm, in the column direction. Such width configuration for the first banks 1 and the second banks 2 will have no disadvantageous influence on the display area of the display substrate.

In order to allow the film forming method for a film layer to have the advantages of simple operation and easy mass production, thereby significantly reducing the production cost, in the embodiments of the present disclosure, the first banks 1 are configured to have a strip shape, and the second banks 2 are configured to have a strip shape.

The embodiments of the present disclosure further disclose a display device comprising the above display substrate. The advantages of the display device are the same as those of the above display substrate, and thus will not be reiterated here. The display device in the embodiments of the present disclosure may include polymer light emitting diode (PLED).

The advantageous effects produced by the embodiments of the present disclosure may comprise at least one of the following effects.

1. In the embodiments of the present disclosure, by fabricating a plurality of first banks and second banks with different heights on the base substrate, two adjacent first banks define a group of sub-pixel units of the display substrate, and two adjacent second banks define one sub-pixel unit. In fabricating a film layer, when a liquid surface of a solution is higher than the height of the second bank, the solution can flow between the sub-pixel units across the second banks with a smaller height, such that there is an equal volume of solution in each sub-pixel unit. As such, a film layer with uniform thickness will be formed in each sub-pixel unit, overcoming the problem of inhomogeneous thickness of the film layers in the sub-pixel units, and in turn improving the homogeneity of light emitting in the sub-pixel units.

2. Because the (top) surface of the second bank has a property of being phobic to the solution, the films formed in respective sub-pixel units, after subsequent drying, are separated, avoiding the interference between the sub-pixel units.

3. Because the (top) surface of the first bank has a property of being phobic to the solution, the solution in each column of the sub-pixel units will not overflow during film forming, avoiding the interference between different columns of sub-pixel units.

4. The film forming method for a film layer according to the embodiments of the present disclosure has the advantages of simple operation and easy mass production, significantly reducing the production cost.

The above description is only a part of the embodiments of the present invention. It should be noted that some modifications and variations can be made by one of ordinary skill in the art without departing from the principle of the present invention. These modifications and variations should also be regarded as falling into the protection scope of the present invention.

What is claimed is:

1. A display substrate comprising:
   a base substrate; and
   a plurality of first banks distributed in a first direction and a plurality of second banks distributed in a second direction on the base substrate, two adjacent first banks defining a group of sub-pixel units of the display substrate, the second banks being disposed between two adjacent first banks, and two adjacent second banks defining one of the sub-pixel units, wherein
   a material of the first bank comprises an organic material, and the first bank has a top surface away from the base substrate, said top surface having a property of being phobic to the solution,
   the first bank has a height greater than a height of the second bank,
   the second bank has a height less than a height of a liquid surface of a solution applied for forming a film layer of the sub-pixel units by a solution process, such that the solution is capable of flowing within each column of sub-pixel units across the second banks,
   the first bank is connected to the second banks on two sides and the second banks on both sides of the first bank have the same height,
   the second bank separates sub-pixel units for emitting light with the same color, the second bank has a size greater than a size of the first bank in the first direction,
   wherein the display substrate further comprises end banks disposed between two adjacent first banks, wherein the end banks are disposed in the same direction as the second banks but on outermost sides of the second banks, and the end banks have a height which is greater than the height of the second bank and is equal to or greater than the height of the first bank, wherein the end bank is disposed at an end of each column of sub-pixel units and has a top surface away from the base substrate having a property of being phobic to the solution, so as to prevent the solution from overflowing from the end of the column during film forming,
   wherein the second bank has a top surface away from the base substrate and a size of the top surface of the second bank in the second direction is smaller than a size of the top surface of the end bank in the second direction.

2. The display substrate according to claim 1, wherein all of the first banks have the same height.

3. The display substrate according to claim 1, wherein the height of the first bank is in a range of from 1 μm to 3 μm.

4. The display substrate according to claim 1, wherein all of the second banks have the same height.

5. The display substrate according to claim 1, wherein the height of the second bank is in a range of from 100 nm to 500 nm.

6. The display substrate according to claim 1, wherein all of the first banks have the same width in a range of from 10 μm to 30 μm in the first direction, and the first banks have a strip shape.

7. The display substrate according to claim 1, wherein all of the second banks have the same width in a range of from 5 μm to 20 μm in the second direction, and the second banks have a strip shape.

8. The display substrate according to claim 1, wherein a material of the second bank comprises an inorganic material, and a top surface of the second bank away from the base substrate has a property of being phobic to the solution.

9. The display substrate according to claim 1, wherein an orthographic projection of the first bank on the base substrate is not overlapped with an orthographic projection of the second bank on the base substrate.

10. The display substrate according to claim 1, wherein the end bank has a size greater than a size of the second bank in the second direction.

11. The display substrate according to claim 1, wherein the film layer of the sub-pixel units formed by the solution process has a height after drying treated, said height being less than the height of the second bank.

12. A display device comprising the display substrate according to claim 1.

13. The display device according to claim 11, wherein the display device includes polymer light emitting diode (PLED).

14. A manufacturing method of a display substrate, comprising:
    fabricating a plurality of first banks in a first direction on a base substrate, two adjacent first banks defining a group of sub-pixel units of the display substrate, wherein a material of the first bank comprises an organic material, and a top surface of the first bank away from the base substrate has a property of being phobic to the solution;
    fabricating a plurality of second banks in a second direction between each pair of two adjacent first banks, two adjacent second banks defining one of the sub-pixel units, wherein the first bank has a height greater than a height of the second bank;
    fabricating a film having a property of being phobic to a solution on a top surface of the second bank, said solution being applied for forming a film layer of the sub-pixel units by a solution process,
    fabricating end banks between two adjacent first banks, wherein the end banks are disposed in the same direction as the second banks but on outermost sides of the second banks, and the end banks have a height which is greater than the height of the second bank and is equal to or greater than the height of the first bank, wherein the end bank is disposed at an end of each column of sub-pixel units and has a top surface away from the base substrate having a property of being phobic to the solution, so as to prevent the solution from overflowing from the end of the column during film forming; and
    fabricating the film layer by the solution process on the base substrate on which the first banks and the second banks are fabricated, a liquid surface of the applied solution having a height between the height of the first bank and the height of the second bank, such that the solution is capable of flowing within each column of sub-pixel units across the second banks;
    wherein the first bank is connected to the second banks on two sides and the second banks on both sides of the first bank have the same height, wherein the second bank separates sub-pixel units for emitting light with the same color, the second bank has a size greater than a size of the first bank in the first direction, wherein the second bank has a top surface away from the base substrate and a size of the top surface of the second bank in the second direction is smaller than a size of the top surface of the end bank in the second direction.

15. The manufacturing method according to claim 14, wherein after fabricating the film layer by a solution process on the base substrate on which the first banks and the second banks are fabricated, the method further comprises: subjecting the film layer fabricated to a drying treatment, such that the treated film layer has a height less than the height of the second bank.

16. The manufacturing method according to claim 14, wherein the end bank has a size greater than a size of the second bank in a second direction.

17. The manufacturing method according to claim 14, wherein the fabricating the film layer by a solution process on the base substrate on which the first banks and the second banks are fabricated comprises:

fabricating the film layer by an ink jet printing process on the base substrate on which the first banks and the second banks are fabricated.

18. The manufacturing method according to claim 14, wherein a material of the second bank comprises an inorganic material, and a top surface of the second bank away from the base substrate has a property of being phobic to the solution.

19. The manufacturing method according to claim 14, wherein the second bank is formed by a deposition process.

20. The manufacturing method according to claim 14, wherein an orthographic projection of the first bank on the base substrate is not overlapped with an orthographic projection of the second bank on the base substrate, and the first bank and the second bank are fabricated in two steps.

\* \* \* \* \*